United States Patent [19]

Koeman

[11] Patent Number: 4,947,355

[45] Date of Patent: Aug. 7, 1990

[54] MODULAR ELECTRONIC INSTRUMENT SYSTEM HAVING AUTOMATED CALIBRATION CAPABILITY

[75] Inventor: Henriecus Koeman, Edmonds, Wash.

[73] Assignee: John Fluke Mfg. Co., Inc., Everett, Wash.

[21] Appl. No.: 190,582

[22] Filed: May 5, 1988

[51] Int. Cl.⁵ .................... G06F 15/20; G01R 35/00
[52] U.S. Cl. ................... 364/571.01; 324/73.1; 364/481; 364/579; 364/550
[58] Field of Search ............ 364/480, 481, 483, 513, 364/550, 551.01, 571.01, 571.04, 571.07, 571.08, 579, 580, 19.1, 200, 900; 371/20; 324/73 AT

[56] References Cited

U.S. PATENT DOCUMENTS

| | | | |
|---|---|---|---|
| 4,488,299 | 12/1984 | Fellhauer et al. | 324/73 AT |
| 4,630,224 | 12/1986 | Sollman | 324/73 AT |
| 4,642,636 | 2/1987 | Smith et al. | 364/571.01 |
| 4,752,868 | 6/1988 | Nicholas et al. | 364/550 |
| 4,763,117 | 8/1988 | Blattner et al. | 364/481 |

Primary Examiner—Kevin J. Teska
Attorney, Agent, or Firm—George T. Noe; Israel Gopstein

[57] ABSTRACT

A modular electronic instrument system having automated calibration capability comprises a system controller and a plurality of calibration instruments for calibrating a target instrument. The instruments, if remotely controllable, may be interconnected by a common interface bus. The calibration instruments have associated therewith a characteristics file including resource capability information, and an instrument to be calibrated has associated therewith a characteristics file including calibration information. The system controller automatically derives calibration requirements from the calibration information and matches the requirements with resource capabilities of the calibration instruments. All of the characteristics files may be provided in a standardized format so that a system may be configured without regard to instrument-specific model numbers or manufacturers.

22 Claims, 1 Drawing Sheet

MODULAR ELECTRONIC INSTRUMENT SYSTEM HAVING AUTOMATED CALIBRATION CAPABILITY

BACKGROUND OF THE INVENTION

The present invention relates to electronic test and measurement systems in general, and in particular to modular electronic instrument systems having automated calibration capability.

Calibration of electronic test and measurement instruments in regular intervals is essential for maintaining proper operation and accuracy. Because values of internal components of such instruments change with age, temperature, and other effects, including catastrophic failure and replacement, recalibration of instruments is required from time to time. The periods of time between recalibration may vary, depending on instrument complexity, use, and other factors.

Recalibration of instruments has traditionally been a time consuming and somewhat tedious task, requiring that a calibration technician assemble proper calibration equipment and then follow a procedure in a manual for the particular instrument to be calibrated. He also has to keep detailed records of equipment model numbers and serial numbers, and the actions he performed. In large calibration depots or laboratories, technicians have often prepared their own calibration procedures, either to match equipment on hand to do the calibration, or to streamline the manufacturer's calibration procedure where possible.

Automated calibration systems, and, in some instances, self-calibrating microprocessor-based instruments, have become commercially available from a number of suppliers. Such automated calibration systems typically include a number of pieces of calibration equipment in a rack along with an instrument controller/computer interconnected by a common interface such as a standard IEEE-488 bus or the like. The calibration equipment comprises precise signal sources and sensors, e.g., signal generators and highly accurate digital multimeters, respectively, used as references for other instruments to be calibrated. The references themselves may be calibrated at predetermined intervals against even more accurate standards such as those which typically reside in a so called "primary standards laboratory" or are present at the National Bureau of Standards.

In prior art automated calibration systems, software controls the display of messages, and where applicable, provides the control of instruments. The instrument controller executes programs specifically written for the instrument to be calibrated, and generally matches the steps described in the manual for that target instrument. Thus the programs simply display messages to instruct a calibration technician to set front-panel controls on the instrument to be calibrated, hook up cables and test leads, control calibration instruments to provide stimulus or a measurement, and to verify operation or make circuit adjustments as required for calibrating a target instrument. After each step is completed, the technician presses a button to allow the calibration system to proceed to the next step. If the target instrument is remote controllable, the automated calibration system may supply an appropriate signal or voltage if instructed to do so at any given step, and to inform the technician whether the specified tolerance is met. Automated calibration systems also automatically keep records of calibration so that, if necessary, detailed information regarding the accuracy of that instrument is available. This is a requirement, for example, in the nuclear power industry. Additionally, some modern microprocessor-controlled target instruments may store correction constants in their memories instead of using variable resistors and capacitors to make necessary adjustments. The correction constants, which may be stored in the target instruments under remote control by the calibration system, may be used as multipliers for each of a number of ranges so that displayed readings are correct for each appropriate range. Examples of situations where correction constants may be appropriate include the voltage ranges of digital voltmeters and the vertical and horizontal deflection factors of oscilloscopes.

While the prior art automated calibration systems have greatly reduced the time required to calibrate instruments, and in many cases have allowed calibration to be carried out by lower skilled personnel, some major drawbacks yet exist. It is necessary that for every target instrument to be calibrated, a specific calibration procedure must be written which matches the requirements for calibration by the maintenance manual applied by the manufacturer. Some of the instructions to the operator can be standardized, such as function, range, and connection messages; however, instructions as to which variable resistor to adjust and within what tolerance must be explicitly created. Moreover, such instructions must be created in the program language for the system controller. Also, such instructions are rather specific as to which calibration instruments, by model number, are used in the system since they must be explicitly programmed to provide the appropriate stimulus or quantity to be measured.

As a rule, calibration instruments are not readily interchangeable among different models or among different manufacturers, and care must be taken to ensure that replacement equipment has the necessary functions and accuracy to perform the calibration and to operate properly in the calibration procedure. It is recognized that, as a rule, calibration equipment must be at least four times more accurate than the instrument to be calibrated, and it is typically very difficult to locate a single replacement for a calibration instrument which adequately provides the required accuracy, particularly if the calibration instrument is to provide several functions, each with different ranges and accuracies.

SUMMARY OF THE INVENTION

In accordance with the present invention, an automated calibration system for an instrument to be calibrated (target instrument) comprises an instrument controller/computer and a plurality of accurate calibration instruments, some of which are remotely controllable by the computer. Remotely controllable instruments may be interconnected with each other through an interface such as an IEEE-488 bus.

Each instrument in the system has its own characteristics file, which may be organized generally in three major sections. The first section, which may be referred to as resource capabilities, includes information as to specifications, e.g., functions, ranges, and accuracies. The second section includes information relating to remote protocol, e.g., which IEEE-488 commands provide a desired operation by the instrument. The third section includes calibration instructions in a standardized format. All instruments do not necessarily have all three sections in their respective characteristics files; however, calibration instruments should have associated therewith at least resource capability information, and target instruments should have associated therewith at least calibration information. This information may be provided to the instrument controller/computer from software, preferably provided by the instrument manufacturer, in any form, such as floppy disks or ROMs resident in the instruments. An instrument controller/computer program can match calibration instruction requirements of a target instrument with resource capabilities/specifications of calibration instruments, and can configure a calibration system independent of specific model numbers of instruments. A procedure can be created using the available resources, and, in fact, the calibration steps can be performed immediately without writing a specific calibration procedure using specific calibration instruments.

The target instrument may or may not be remotely controllable by the controller/computer, as evidenced by the presence or lack of remote protocol information (the second section of the characteristics file mentioned above), and the calibration of the target instrument may or may not be remotely controllable. However, the target instrument has associated therewith calibration information, as mentioned above, which may be used by the controller/computer to effect either automatic or manual calibration, and if the target instrument is not remotely controllable, the controller/computer can still automatically generate instructions to a calibration technician.

It is therefore one object of the present invention to provide a novel modular electronic instrument system having automated calibration capability.

It is another object of the invention to provide an automated instrument calibration system that takes advantage of standardized database formats, which represent the capabilities, remote control command set, and calibration information.

It is a further object of the invention to provide an automated instrument calibration system capable of automatically configuring appropriate calibration instruments for an instrument to be calibrated, independent of specific instrument model numbers.

It is still another object of the invention to provide a computerized instrument calibration system wherein an instrument to be calibrated has associated therewith a set of calibration instructions that can be read and implemented by the system's computer, and each calibration instrument has associated therewith resource capability information that the system computer can automatically match with the requirements of the instrument to be calibrated.

Other objects, advantages, features, and attainments of the present invention will become obvious to those having ordinary skill in the art upon a reading of the following description when taken in conjunction with the accompanying drawings.

DETAILED DESCRIPTION OF THE INVENTION

Figure 1:
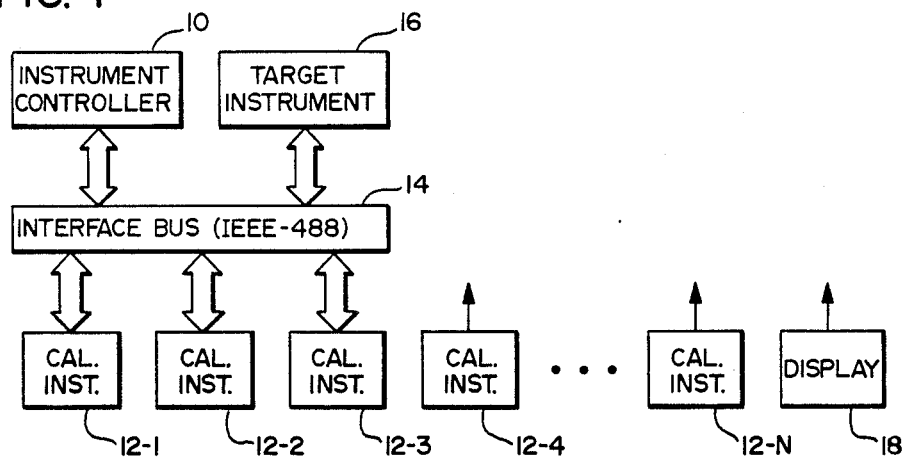
FIG. 1 is a generalized block diagram of an automated calibration system in accordance with the present invention.

Referring to FIG. 1, there is shown an automated calibration system comprising an instrument controller 10 and a plurality of accurate calibration instruments 12-1 through 12-N, some of which may be remotely controllable by the instrument controller 10. Remotely controllable instruments may be interconnected with each other, as well as with the instrument controller 10, through an interface bus 14. Interface bus 14 may suitably be a General Purpose Interface Bus (GPIB) in accordance with IEEE-488. A target instrument 16, for which calibration is desired, may or may not be connected to interface bus 14, depending on whether or not the target instrument is remotely controllable.

Instrument controller 10 suitably may include a computer or a microprocessor, or indeed be a computer. Instruments 12-1 through 12-N may comprise any of a number of calibration instruments in any desired combination. Examples of such calibration instruments include square-wave and sine-wave generators, time mark generators, universal counter/timers, programmable power supplies, digital multimeters, oscilloscopes, and other such well known instruments.

The present invention may suitably take advantage of standardized (or proposed as standards) database formats to represent instrument characteristics currently under development by the Institute of Electrical and Electronic Engineers (IEEE) P981 Committee, and standardized programming, such as ATLAS (Abbreviated Test Language for All Systems), currently being used by the U.S. Department of Defense and its contractors. The instrument characteristics description methods under development by the IEEE P981 Committee cover the instrument specification in terms of function, accuracy, resolution, and range, and also cover remote control protocol. This information, which may be referred to as a "characteristics file," may be provided in an ASCII file to facilitate system integration and execution of ATLAS or other test programs.

Each instrument in the automated calibration system of FIG. 1, including both the calibration instruments 12-1 through 12-N and the target instrument 16 since it may also be used as a calibration instrument, has associated therewith its own characteristics file. The characteristics file may be provided, preferably but not necessarily by the instrument manufacturer, as software to be loaded into the database of instrument controller 10. Such software may be, of course, in the form of recorded media, such as a floppy disk, or in the form a read-only memory (ROM) resident in the instrument.

Figure 2:
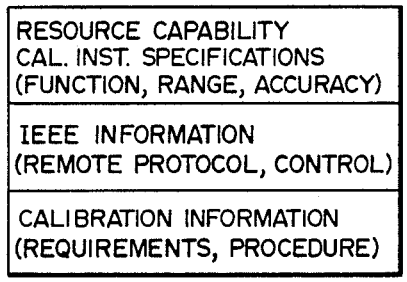
FIG. 2 depicts a characteristics file for each instrument of the system shown in FIG. 1.

The characteristics file for each instrument may be organized generally in three major sections. See FIG. 2. The first section, which may be referred to as resource capabilities, includes information as to instrument specifications, e.g., functions, ranges, and accuracies. The second section includes information relating to remote protocol, e.g., IEEE-488 command set. The third section includes calibration instructions in a standardized format. All instruments do not necessarily have all three sections in their respective characteristics files; however, calibration instruments should have associated therewith at least resource capability information, and target instruments should have associated therewith at least calibration information. The calibration software running on the instrument controller 10 can match calibration instruction requirements of a target instrument with resource capabilities/specifications of calibration instruments, and can configure a calibration system independent of specific model numbers of instruments. A procedure can be created using the available resources, and, in fact, the calibration steps can be performed immediately without writing a specific calibration procedure using specific instruments.

For a general-purpose automated calibration system, it would be desirable to not have to rely upon specific instruments suggested in calibration instructions of a target instrument 16. For example, it may be desirable under certain conditions, such as equipment malfunction and lack of availability of another unit, to replace a particular type of instrument from one manufacturer with a similar type of instrument from another manufacturer, or even with a number of instruments from a number of manufacturers, if necessary, wherein the replacement instrument or set of instruments is capable of satisfying the requirements of measuring signals from the target instrument 16 or providing calibration stimulus thereto. While changes could be made to the test program to accommodate the replacement instrument, it would be preferable to have a completely automated closed-loop system in which instruments could be replaced with similar instruments without regard to specific model numbers or manufacturers.

The instrument controller 10, in configuring the system to perform calibration on some target instrument 16, uses target instrument software to review the calibration instruction requirements in the characteristics file for the target instrument, as discussed hereinabove, and then uses calibration instrument software to search the resource capability section of characteristics files of the calibration instruments by reviewing a stored library or by polling the instruments in the system to locate instruments having the functions, ranges, and accuracies to find the instruments able to perform the calibration. Generally, the calibrating instrument should have an accuracy at least four times that of a target instrument. Having identified the appropriate calibration instruments, the controller 10 then checks the characteristics file of the target instrument for the presence or absence of remote protocol information to determine whether the calibration step can be performed under remote control or not. If it can, the remote control instructions will be sent over the interface (remote control) bus 14. If the calibration step cannot be performed under remote control, instrument controller 10 will automatically generate instructions in the form of messages displayed on a display device 16 such as a video screen to prompt or instruct a calibration technician to perform manual steps, such as setting front-panel switches and adjusting internal variable components.

Figure 3:
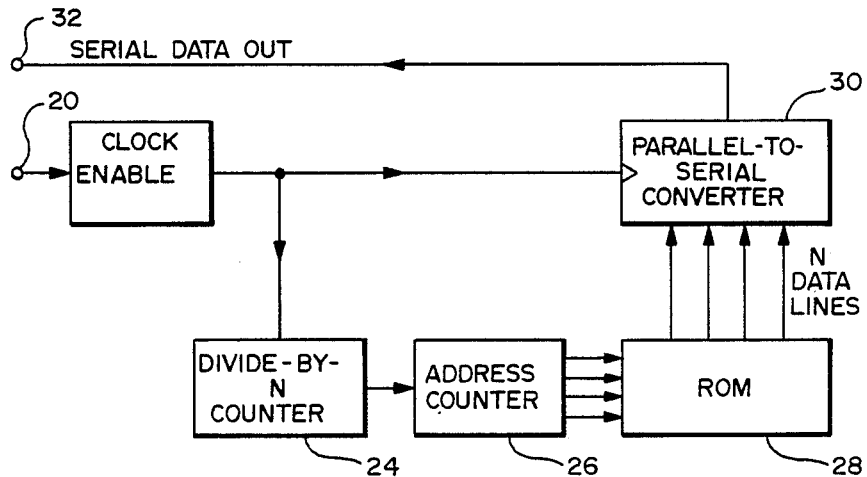
FIG. 3 is a schematic diagram of a two-lead circuit for reading the contents of a ROM.

Even target instruments not having a remote interface may be calibrated using the system of the present invention, as long as a characteristics file is created or available. For example, consider a small hand-held digital multimeter having only two test leads. The manufacturer could provide a characteristics file in a ROM resident in the multimeter, and by connecting the ground lead to a control line and the measurement lead to a serial data line, the system can read the characteristics file and then prompt a technician throughout a calibration procedure. FIG. 3 shows a simple circuit that allows a characteristics file of a small instrument having only two leads to be read by the system. Terminal 20 is connected via a test lead to a control line in the system over which an enable signal is provided. The enable signal activates a clock 22, which applies clock pulses via a divide-by-N counter 24 to an address counter 26. The address counter 26 addresses storage locations in ROM 28, and the data is output in N-bit parallel format from ROM 28 to a parallel-to-serial converter 30. The clock pulses from clock 22 are also applied undivided to the clock input of parallel-to-serial converter 30 to clock the data out in a serial stream to the system controller 10 via a terminal 32. The data is reassembled in parallel format in the instrument controller 30 for use in generating the calibration procedure.

By having each instrument in the system provide its own complete information, many options may be provided for carrying out calibration of a target instrument, depending upon such factors as the capabilities and level of sophistication of the instruments themselves, the technical level of persons performing the adjustments and verifications, and conditions under which calibration is conducted. As an example of such an option, it is possible to prompt the person who prepares the calibration procedure for any changes that may be desired. For example, the calibration software may indicate that in order to calibrate a target instrument such as a digital voltmeter at the 10-volt D.C. range with a tolerance of 1%, a calibration instrument with 10-volt D.C. capability and 0.1% accuracy is recommended. The person preparing the calibration procedure may agree or disagree with this recommendation, and override the recommendation with another calibration instrument selected to provide the electrical signals for this step of the procedure. Also, algorithms may be provided which tend to promote the continued use of a selected instrument. This feature could, of course, minimize changes to the interconnection between the target instrument and the calibration instruments.

During the preparation phase of a particular calibration procedure, the requirements for calibration set forth in the calibration instructions section of the characteristics file of the target instrument are matched with the specifications of the calibration instruments in the system as described in the resource capabilities section of the characteristics file of the calibration instruments. Of course, if the instrument controller 10, operating under control of calibration software, is not successful in finding an instrument with adequate accuracy, it may suggest an instrument with the best accuracy available and leave it up to the calibrating technician to decide whether to continue or not. Such reduced accuracy would, of course, reduce the quality of the calibration; however, this may be acceptable to the owner of the target instrument. Appropriate notes could be added to the calibration report. Also, it may happen that certain quantities required in the calibration instructions of the target instrument are not available. This is frequently the case when calibrating the resistance measurement function of digital multimeters. For example, in accordance with the calibration instructions for a particular target instrument, the resistance function at the 200-ohm range should be calibrated at 190 ohms, and an otherwise suitable calibration instrument in the system provides only certain resistance values, such as 10, 100, and 1000 ohms. In the system of the present invention, the instrument controller 10 could make a recommendation to use the 100 ohms available and adjust tolerance requirements so that the calibration step still may be performed satisfactorily.

It is also possible in the system of the present invention that each procedural step is executed as soon as the matching of requirements and capabilities has occurred. Typically, in a manual calibration system, at least, this will not be done since the actual execution of calibration will be left to a lower skilled calibration technician, while the conformation of recommendations by the calibration software to match requirements with capabilities is done by a higher skilled metrologist.

As mentioned previously, the availability of remote interfaces target instruments and calibration instruments impact the execution of calibration. If the target instrument as well as all of the calibration instruments have remote interfaces, it is possible that calibration can be performed in a closed-loop system, totally automatically without intervention from a human operator other than perhaps making initial connections and disconnecting the equipment when calibration is complete. Automatic calibration, however, requires that no changes to the wiring are necessary, that remotely controlled switching devices are available, and that the target instrument uses electronically controlled calibration constants. There are already commercially available instruments having this capability.

As a practical matter, a more typical situation would be one based on the current technology of the installed base of electronic test instruments in which the target instrument has a remote interface and adjustment of variable controls are made by a calibration technician. The calibration instructions in the characteristics file of the target instrument contain this information which is retrieved by the instrument controller 10, as discussed earlier, and utilized to prompt the technician during calibration. If the target instrument does not have a remote interface, the technician needs additional instructions for setting up front-panel and internal control settings. While this information may be explicitly mentioned in the calibration instructions of the target instrument, it also may be generated automatically from the listing of calibration requirements provided by the characteristics file of the target instrument. The absence of a remote interface is indicated by the absence of remote protocol information, and the instrument controller 10 can recognize the difference and either provide remote control of the target instrument or provide instructions to a technician as necessary.

It should be pointed out that extremely accurate calibration instruments do not always have remote interfaces, and again, the instrument controller 10 will detect the absence of remote protocol information and provide, in place of remote commands, instructions to a technician to indicate which manual steps are necessary. This situation may very well occur when the calibration instruments themselves need calibration. It could be that an extremely accurate instrument from the primary standards laboratory is brought to the calibration system. The description in the characteristics file of that extremely accurate instrument may be added to the library of instruments in the system, and the instrument then may function as either a calibrating instrument or a target instrument.

Of course, such an automated calibration system as herein described is capable of maintaining a complete record of calibration of a target instrument, and such information may be directed to a printer to provide a printed report.

As can be discerned from the foregoing description, a very flexible and standardized calibration system executes calibration procedures developed from the characteristics files of the instruments in the system, independent of specific instrument models and manufacturers. It will, accordingly, become obvious to those having ordinary skill in the art that many changes and modifications can be made to the system of the present invention without departing from the invention in its broader aspects.

What I claim as being novel is:

1. A modular electronic instrument calibration system, comprising:
   an instrument to be calibrated having associated therewith a characteristics file including calibration information;
   one or more calibration instruments connectable to said instrument to be calibrated, each of said calibration instruments having associated therewith a characteristics file including resource capability information; and
   control means for automatically deriving requirements for calibration from said calibration information, and matching said requirements with said resource capability information.

2. A modular electronic instrument calibration system in accordance with claim 1 wherein said calibration information comprises calibration instructions in standardized format.

3. A modular electronic instrument calibration system in accordance with claim 1 wherein said control means automatically configures calibration instruments with an instrument to be calibrated, independent of specific model members of said calibration instruments.

4. A modular electronic instrument calibration system in accordance with claim 1 wherein said control means further creates calibration steps from said requirements and said resource capability information.

5. A modular electronic instrument calibration system in accordance with claim 4 wherein said calibration steps are performed automatically under remote control by said control means.

6. A modular electronic instrument calibration system in accordance with claim 4 wherein said calibration steps are displayed by said control means in the form of instruction messages.

7. A modular electronic instrument calibration system in accordance with claim 1 further comprising an interface bus, wherein said control means and at least one of said calibration instruments are coupled to said bus.

8. A modular electronic instrument calibration system in accordance with claim 7 wherein said instrument to be calibrated is also coupled to said bus, and the characteristics files of said instrument to be calibrated and said calibration instruments include remote control information.

9. An automated calibration system for calibrating a target instrument, said calibration system comprising:
   one or more calibration instruments connectable to said target instrument;
   means for providing calibration requirements of said target instrument in standardized format;
   means for providing resource capabilities of said calibration instruments in standardized format; and
   means for matching said requirements with said resource capabilities and generating therefrom calibration steps.

10. An automated calibration system in accordance with claim 9 wherein said means for matching said requirements with said resource capabilities comprises an instrument controller including a processor.

11. An automated calibration system in accordance with claim 10 wherein said means for providing calibration requirements of said target instrument is target instrument software, and said means for providing resource capabilities of said calibration instruments is calibration instrument software.

12. An automated calibration system in accordance with claim 11 wherein both said target instrument software and said calibration instrument software include remote control information, and said instrument controller automatically connects said calibration instruments to said target instrument under program control and instructs said calibration instruments to provide stimulus signals to said target instrument.

13. An automated calibration system in accordance with claim 12 wherein said instrument controller further provides calibration instruction messages to a display device.

14. An automated calibration system in accordance with claim 12 wherein said instrument controller provides calibration instructions directly to said target instrument.

15. In an automated test system having at least one instrument and a computer controller therefor, the computer controller accessing a characteristics file describing functions and properties of the instrument for generating test instructions therefor, the improvement comprising:

a calibration file describing calibration information for the instrument;

at least one calibration instrument connected to said computer controller, a calibration instrument file describing characteristics of each calibration instrument, said computer controller accessing said calibration file to determine a calibration procedure for the instrument and accessing said calibration instrument file to identify at least one calibration instrument for use in said calibration procedure.

16. An improved test system as recited in claim 15, wherein said computer controller further operates to generate a sequence of steps for said calibration procedure corresponding to said at least one calibration instrument used in said calibration procedure.

17. An improved test system as recited in claim 15, wherein said computer controller further operates to generate a sequence of displays for instructing technical personnel to carry out for said calibration procedure a sequence of steps corresponding to said at least one calibration instrument used in said calibration procedure.

18. An improved test system as recited in claim 15, wherein said instrument is remote controllable and further comprising an IEEE information file describing remote control protocol for said instrument, said computer controller accessing said IEEE information file for providing control signals for said instrument.

19. An improved test system as recited in claim 15, wherein said calibration instrument is remote controllable and further comprising an IEEE information file describing remote control protocol for said calibration instrument, said computer controller accessing said IEEE information file for providing control signals for said calibration instrument.

20. An improved test system as recited in claim 15, wherein said instrument includes internal storage for said calibration file, said computer controller connected to said instrument for accessing information from said calibration file to establish said calibration procedure for said instrument.

21. An improved test system as recited in claim 15, wherein said calibration instrument includes internal storage for said calibration instrument file, said computer controller connected to said calibration instrument for accessing information from said calibration instrument file to identify said calibration instrument for use in said calibration procedure for said instrument.

22. An improved test system as recited in claim 21, wherein said computer controller further identifies said at least one calibration instrument for use in said calibration procedure by determining capabilities required of said calibration instrument from said calibration file describing calibration information for the instrument and by searching through the calibration instrument file for each calibration instrument available for carrying out the calibration procedure.

* * * * *